United States Patent
Mochizuki et al.

(10) Patent No.: US 8,294,519 B2
(45) Date of Patent: Oct. 23, 2012

(54) POWER AMPLIFYING APPARATUS AND POWER AMPLIFYING METHOD

(75) Inventors: Ryo Mochizuki, Fuchu (JP); Takao Kato, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/017,895

(22) Filed: Jan. 31, 2011

(65) Prior Publication Data

US 2011/0227654 A1   Sep. 22, 2011

(30) Foreign Application Priority Data

Mar. 17, 2010   (JP) .................. P2010-060985

(51) Int. Cl.
*H03G 3/10* (2006.01)
(52) U.S. Cl. ...................... 330/285; 330/296
(58) Field of Classification Search .......... 330/285, 330/296
See application file for complete search history.

(56) References Cited

U.S. PATENT DOCUMENTS

| | | | |
|---|---|---|---|
| 6,683,496 B2 * | 1/2004 | Poggi et al. | 330/132 |
| 6,750,724 B1 | 6/2004 | Mori et al. | |
| 7,049,892 B2 * | 5/2006 | Matsunaga et al. | 330/285 |
| 7,215,203 B2 * | 5/2007 | Matsunaga et al. | 330/285 |
| 7,560,992 B2 * | 7/2009 | Vejzovic | 330/296 |
| 2010/0109778 A1 * | 5/2010 | Ichitsubo et al. | 330/285 |

FOREIGN PATENT DOCUMENTS

| | | |
|---|---|---|
| JP | 11-145736 | 5/1999 |
| JP | 2004-228661 | 8/2004 |
| WO | WO 02/19518 A1 | 3/2002 |

OTHER PUBLICATIONS

Japanese Notice of Reasons for Refusal issued in Counterpart Japanese Patent Application No. JP2010-060985, dated Jan. 17, 2012 (5 pages total).

* cited by examiner

*Primary Examiner* — Henry Choe
(74) *Attorney, Agent, or Firm* — Finnegan, Henderson, Farabow, Garrett & Dunner, L.L.P.

(57) ABSTRACT

A power amplifying apparatus according to an embodiment includes a first amplifying unit having a first amplifying element to amplify an input signal, a second amplifying unit having a second amplifying element to amplify an output signal from the first amplifying unit; and a bias supply unit giving bias values to the first amplifying element and the second amplifying element, respectively, the bias values causing the first amplifying element and the second amplifying element to operate in a non-linear region.

2 Claims, 3 Drawing Sheets

US 8,294,519 B2

POWER AMPLIFYING APPARATUS AND POWER AMPLIFYING METHOD

CROSS-REFERENCE TO RELATED APPLICATIONS

This application is based upon and claims the benefit of priority from Japanese Patent Application No. 2010-060985, filed on Mar. 17, 2010; the entire contents of which are incorporated herein by reference.

FIELD

Embodiments described herein relate generally to a power amplifying apparatus and a power amplifying method used in, for example, radio equipment in a satellite earth station, or the like.

BACKGROUND

In radio equipment in a satellite earth station communicating with artificial satellites, a power amplifying apparatus amplifying a signal having a microwave frequency (particularly the SHF band or higher) is needed. In recent years, in view of efficiency, maintenance, and so on, development of solid-state power amplifying apparatuses is in progress. Instead of traveling wave tube amplifiers (TWTA) using traveling wave tubes as one type of vacuum tube, solid state power amplifiers (SSPA) using field effect transistors (FET) are gaining popularity. This tendency becomes significant as development of power amplifying FETs with higher efficiency and more power advances. Particularly, FETs using material of gallium nitride (hereinafter referred to as GaN) have contributed largely to improvement in transmission output of the SSPA.

Now, the radio equipment in the satellite earth station or the like is required to comply with related regulations such as the Radio Law as well as various technical standards. A distortion characteristic expressed by third-order intermodulation product (IM3) or re-growth is one of technical standards which such radio equipment should satisfy.

As methods to improve the distortion characteristic (distortion compensation), many methods such as digital pre-distortion, feed-forward, and so on are known. As a distortion compensation method which does not require any special circuit, there has been proposed one which cancels out distortions using plural stages of FET amplifiers.

However, in satellite communication, operations with various level diagrams from high-power transmission over 100 W to low power transmission less than 1 W are expected, and thus it is required to satisfy the distortion characteristic in a wide range of transmission power.

DETAILED DESCRIPTION

Figure 1:
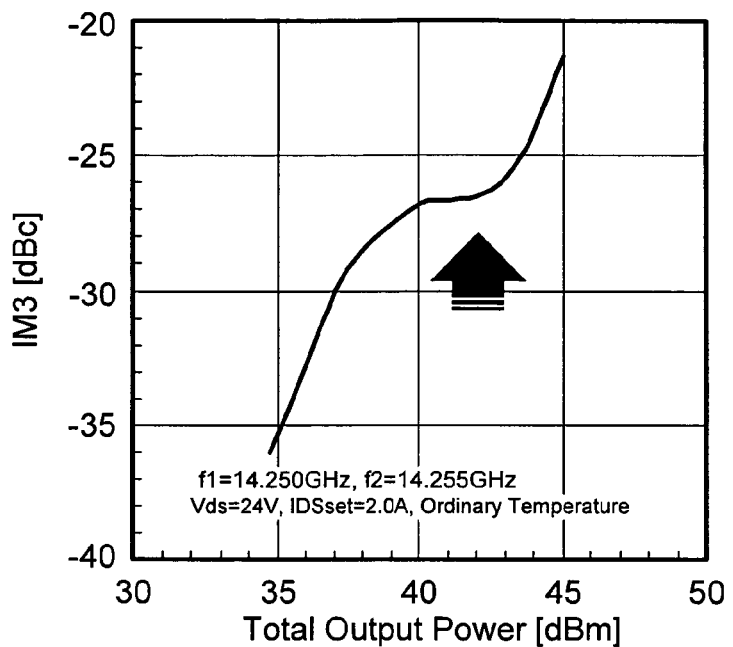
FIG. 1 is a diagram illustrating an IM3 characteristic with respect to output power of an amplifying element used in a power amplifying apparatus according to an embodiment of the present invention.

A power amplifying apparatus according to an embodiment includes a first amplifying unit having a first amplifying element to amplify an input signal, a second amplifying unit having a second amplifying element to amplify an output signal from the first amplifying unit, and a bias supply unit giving bias values to the first amplifying element and the second amplifying element, respectively, the bias values causing the first amplifying element and the second amplifying element to operate in a non-linear region.

(The Principle of Distortion Compensation)

The embodiment suppresses distortion components in an amplifier output by operating an amplifier forming the power amplifying apparatus at a predetermined operating point. Accordingly, first the principles of occurrence of the IM3 and distortion compensation will be described.

The IM3 is a part of distortion components occurring when two waves of signals with the same amplitude are applied to an amplifier, or the like. Assuming that a time-harmonic input signal is x and a time-harmonic output signal is y, a spurious signal due to a non-linear distortion can be represented as follows.

$$y = k_0 + k_1 x + k_2 x^2 + k_3 x^3 \tag{1}$$

Assuming that there are two waves of input signals $X_1 \cos \omega_1 t$ and $X_2 \cos \omega_2 t$, when these signals are substituted for $x^3$ in the expression (1) to obtain a third-order component $y_3$, the IM3 appears as a component represented by angular frequencies $(2\omega_1 - \omega_2)$ and $(\omega_1 - 2\omega_2)$ in the following expression.

$$\begin{aligned} y_3/k_3 &= x_3 \\ &= \ldots + \frac{3}{4} X_1^2 X_2 \cos(2\omega_1 - \omega_2)t + \\ &\quad \frac{3}{4} X_1 X_2^2 \cos(\omega_1 - 2\omega_2)t + \ldots \end{aligned} \tag{2}$$

Here, the power ratio between the output signal y and the IM3 can be represented as follows.

$$IM3 = \frac{(k_1 X_1)^2}{\left(\frac{3}{4} k_3 X_1^2 X_2\right)^2} \tag{3}$$

That is, when the amplitudes of the input signals are $X_1 = X_2$ and equal, the increase ratio between the amplitudes of the input signals and the amplitude of the IM3 is 1:3.

However, the IM3 also occurs from a non-linearity of phase, besides the case where it occurs from a non-linearity related to amplitudes as derived by the expression (3). Assuming that there are two waves of input signals $X_1 \cos\{(\omega_0 + \Delta_1)t + \phi_1\}$ and $X_2 \cos\{(\omega_0 + \Delta_2)t + \phi_2\}$ and the input signal x combining these signals is x=X cos(ω₀t+φ), the output signal y can be represented by the following expression.

$$y = Y(X)\cos(\omega_0 t + \phi + \theta(X)) \quad (4)$$

The expression (4) is a function such that the amplitude X of the combined input signal is amplified and becomes Y(X), and changes in phase by θ(X). When the expression (4) is expanded using a formula of trigonometric function, the frequency, phase, and amplitude component of the occurring IM3 can be derived. To obtain derivatives with which the derived amplitude component of the expression becomes a minimum extreme value, these derivatives are represented by the following expressions, assuming that an AM-AM characteristic is Y(X)/X, and an AM-PM characteristic is θ(X).

$$G_P(X) = \frac{Y(X)}{X}\cos\theta(X) \quad (5)$$

$$\frac{dG_P(X)}{dX} = \frac{dG(X)}{dX}\cos\theta(X) - G(X)\sin\theta(X)\frac{d\theta}{dX} = 0 \quad (6)$$

There are two conditions as follows for these derivatives to hold true.

$$\text{Linear condition } \frac{dG(X)}{dX} = 0, \quad (7)$$
$$\frac{d\theta}{dX} = 0$$

$$\text{Compensation condition } \frac{d\theta}{dX} = \frac{\cos\theta(X)}{G(X)\sin\theta(X)} \quad (8)$$

The expression (7) represents a situation that "Y(X)/X=G(X)=constant, and θ(X)=constant" in the expression (5), and indicates that no distortion occurs in an ideal linear characteristic. The expression (8) indicates that increases in the amplitudes of the input signals and the amplitude of the IM3 is not locally the ratio of 1:3, and there is a region (minimum value) where the IM3 improves extremely. This means that a local minimum point can be obtained in the IM3 by balancing changes in amplitudes and phases. In short, it is indicated that the IM3 can be improved by changing the operating points of the amplifiers (amplifying elements) of the power amplifying apparatus.

The embodiment sets the operating points of the amplifying elements of the power amplifiers to this minimum value, thereby improving the overall IM3. Specifically, a structure with two stages of power amplifiers is provided, the operating points of the amplifying elements of the respective power amplifiers are set in a non-linear region, and amplification in the first stage and amplification in the last stage are operated in a state that the amplifier output is distorted. Thus, the distortion components can be cancelled out in the entire power amplifying apparatus, thereby improving the IM3.

(The Operating Points of the Amplifying Elements)

Next, the operating points of the amplifying elements will be described. FIG. 1 illustrates an example of an IM3 characteristic of a GaN FET. As illustrated in FIG. 1, in the IM3 characteristic of the GaN FET, the minimum point due to the compensation condition of the expression (8) appears clearly (indicated by an arrow in the diagram). Accordingly, the relation between the operating point of the GaN FET and the IM3 characteristic was examined.

Figure 2:
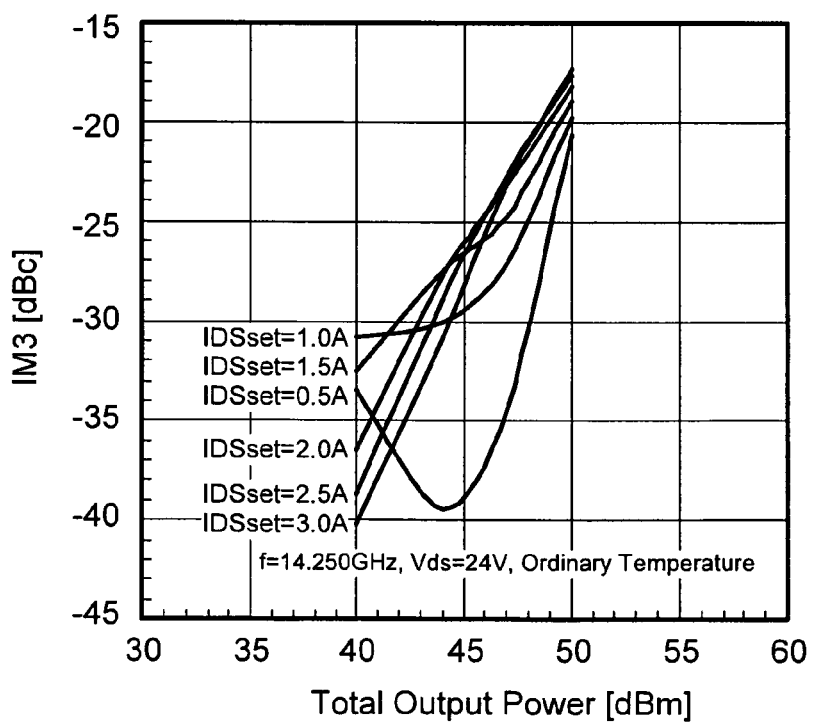
FIG. 2 is a diagram illustrating the IM3 characteristic with respect to output power when an idle current of the amplifying element illustrated in FIG. 1 is varied.

FIG. 2 illustrates changes in the IM3 when an idle current ($I_{DSset}$) of the GaN FET is varied from 0.5 A to 3.0 A in units of 0.5 A in the power amplifier using the GaN FET. As illustrated in FIG. 2, when the $I_{DSset}$ is increased, the IM3 characteristic of the GaN FET gets close to a straight line indicating the relation of 1:3 between the increase ratio of the output signal and the IM3 characteristic. In short, it is a state that the IM3 characteristic changes by a change in the amplifier output.

On the other hand, when the $I_{DSset}$ is decreased continuously, although there is a tendency of the IM3 to deteriorate when a small signal is amplified, it can be seen that the minimum point occurs when a large signal is amplified with $I_{DSset}$=0.5 A. This indicates that, in the power amplifier using the GaN FET, it is possible to obtain a region where the IM3 characteristic improves stably with respect to a change in the amplifier output by making an operating state with the $I_{DSset}$ being suppressed.

As illustrated in FIG. 1 and FIG. 2, the region where the IM3 improves appears when the $I_{DSset}$ is around 2.0 A, and as it decreases to 1.5 A, 1.0 A, and so on, the improved region of the IM3 characteristic becomes large. On the other hand, when the $I_{DSset}$ becomes 1.0 A or less, a region where the IM3 locally improves appears. Further, when the $I_{DSset}$ becomes less than 0.5 A, the improvement point peak of the IM3 becomes sharp and there is a tendency of the gain to decrease. That is, with the $I_{DSset}$ being in the range of 0.5 A to 1.5 A, it can be seen that there appears a region where the IM3 stably improves with respect to a change in the amplifier output.

In addition, in FIG. 2, a current $I_{dss}$ which flows through a drain terminal when a gate bias voltage $V_g$ is set to 0 (zero) is 10 A. Thus, with reference to this current $I_{dss}$, the range of the current $I_{DSset}$ from 0.5 A to 1.5 A corresponds to the range of 5% to 15% of this reference. By combining amplifiers operated in such a region, a power amplifying apparatus having an improved IM3 characteristic stably with respect to a change in the amplifier output can be obtained.

In the embodiment, based on this information, the amplifiers operated at the operating point by which the IM3 improves are connected serially in two stages. Consequently, the IM3 characteristic of the entire power amplifying apparatus is improved, and the IM3 is improved stably in a wide output level.

Structure of the Embodiment

Figure 3:
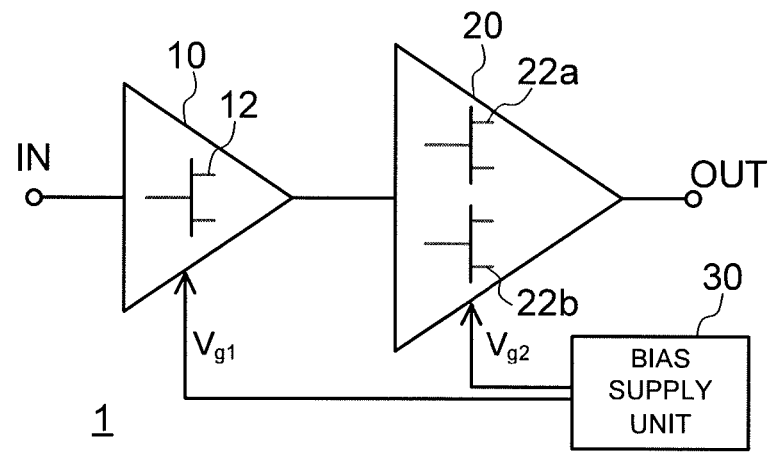
FIG. 3 is a block diagram illustrating the structure of the power amplifying apparatus according to the embodiment of the present invention.

Hereinafter, the embodiment will be described in detail with reference to the drawings. As illustrated in FIG. 3, a power amplifying apparatus 1 according to the embodiment includes a first amplifying unit 10 as a first-stage amplifier, a second amplifying unit 20 as a last-stage amplifier, and a bias supply unit 30. This power amplifying apparatus 1 has a two-stage structure having the first amplifying unit 10 and the second amplifying unit 20, and amplifies a transmission signal given to an input IN to a predetermined power level and outputs the amplified signal to an output OUT.

The first amplifying unit 10 is formed of an amplifying circuit having a first amplifying element 12, which is an FET or the like for example, and the second amplifying unit 20 is formed of an amplifying circuit having second amplifying elements 22a, 22b, which are likewise FETs or the like. The first amplifying element and the second amplifying element may each be structured of a plurality of elements. For example, the first amplifying unit 10 can be structured as a single amplifying circuit using one first amplifying element 12, and the second amplifying unit 20 can be structured as a push-pull amplifying circuit using two second amplifying elements 22a and 22b.

Desirably, a semiconductor element having a wide range to be a non-linear region is used for the first amplifying element 12 and the second amplifying elements 22a, 22b. The GaN FET has a wide operating range to be the non-linear region as compared to a GaAs FET, and is capable of obtaining a region with a good IM3 characteristic when the $I_{DSset}$ is suppressed, as described above. Thus, the GaN FET is preferred for the first and second amplifying elements.

The bias supply unit 30 generates bias voltages $V_{g1}$ and $V_{g2}$ causing the first amplifying element 12 provided in the first amplifying unit 10 and the second amplifying elements 22a, 22b provided in the second amplifying unit 20 to be at their respective predetermined operating points, and supplies these bias voltages to the first and second amplifying elements, respectively.

(Example of the Operating Points of the Embodiment)

Figure 4:
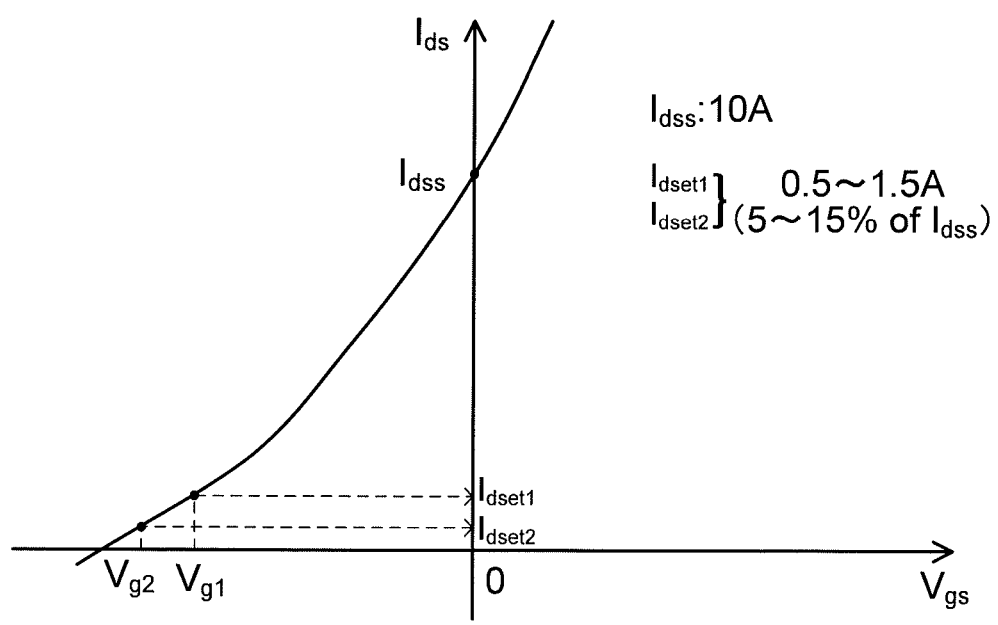
FIG. 4 is a diagram illustrating an $I_{ds}$-$V_{gs}$ characteristic of the amplifying element used in the power amplifying apparatus illustrated in FIG. 3.

FIG. 4 is a diagram illustrating a characteristic example of drain currents with respect to gate voltages of the first and second amplifying elements of the power amplifying apparatus according to this embodiment. Here, the GaN FET which obtained the characteristic illustrated in FIG. 1 and FIG. 2 is used for the first and second amplifying elements. As described above, in the GaN FET described with FIG. 1 and FIG. 2, the IM3 characteristic improves when the drain currents are in the range of about 5% to about 15% with reference to the current $I_{dss}$ flowing through the drain terminal when the gate bias voltage $V_g$ is set to 0 (zero).

As illustrated in FIG. 4, the bias voltages $V_{g1}$ and $V_{g2}$ supplied to the first amplifying element 12 and the second amplifying elements 22a, 22b, respectively, are set to voltages $V_{g1}$ and $V_{g2}$ which cause drain currents $I_{dset1}$, $I_{dset2}$ of about 5% to about 15% with reference to the current $I_{dss}$ which flows through the drain terminal when the gate and the source of the FET as an amplifying element is short-circuited (when the gate bias voltage $V_g$ is set to 0 (zero)). This is equivalent to the range of 25% to 50% with respect to a standard current defined by the single FET (drain current for performing a standard linear amplifying operation).

In the region where the drain current becomes 5% to 15% of the reference current $I_{dss}$ the IM3 characteristic of the GaN FET improves as described above. In this region, an input-output characteristic of the amplifying circuit is in a region of a non-linear characteristic, and this region is also an operating state that originally many distortion components are contained in the amplifier output. That is, in this embodiment, the two amplifying units forming the power amplifying apparatus 1 are both operated in the non-linear region where many distortions occur. Through such operation, noise components occurring in the first amplifying unit 10 as the first stage cancels out noise components occurring in the second amplifying unit 20 as the last stage, thereby making it possible to obtain a sufficient IM3 characteristic regardless of the level of the amplifier output.

Figure 5:
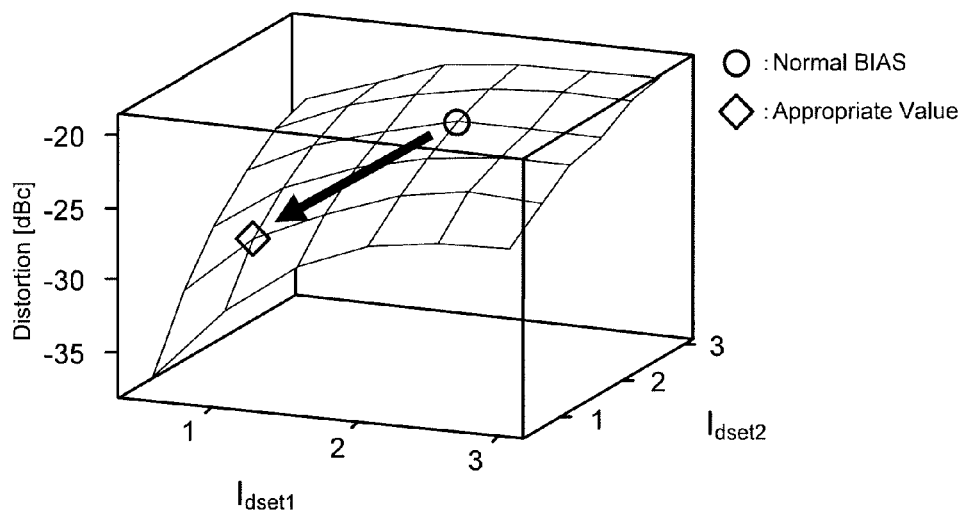
FIG. 5 is a diagram illustrating a relation between respective idle currents of a first amplifying unit and a second amplifying unit and the IM3 characteristic in the power amplifying apparatus illustrated in FIG. 3.

FIG. 5 is a diagram illustrating the relation between the drain currents (idle currents) $I_{dset1}$, $I_{dset2}$ when the respective bias voltages $V_{g1}$, $V_{g2}$ are supplied and the IM3 characteristic of the entire power amplifying apparatus 1 caused by these drain current settings, where the first and second amplifying elements are both the GaN FET. As illustrated in FIG. 5, it can be seen that when the drain currents $I_{dset1}$ and $I_{dset2}$ of the first amplifying unit 10 and the second amplifying unit 20 become 5 A or less, IM3 of about −30 dBc is obtained.

In addition, as illustrated in FIG. 5, a change in the IM3 characteristic due to a change in the $I_{dset1}$ and a change in the IM3 characteristic due to a change in the $I_{dset2}$ are different. This is conceivably caused by that levels on a level diagram are different between the first amplifying unit 10 and the second amplifying unit 20, and amplifier gains are different therebetween. In this embodiment, a favorable IM3 characteristic is obtained particularly when the $I_{dset1}$ of the first amplifying unit 10 is about 5% to about 15% of the reference current $I_{dss}$ and the $I_{dset2}$ of the second amplifying unit 20 is likewise about 5%. That is, the IM3 characteristic of the entire power amplifying apparatus become favorable when the second amplifying unit 20 as the last stage is operated to provide an amplifier output which is more distorted than that of the first amplifying unit 10 as the first stage.

Figure 6:
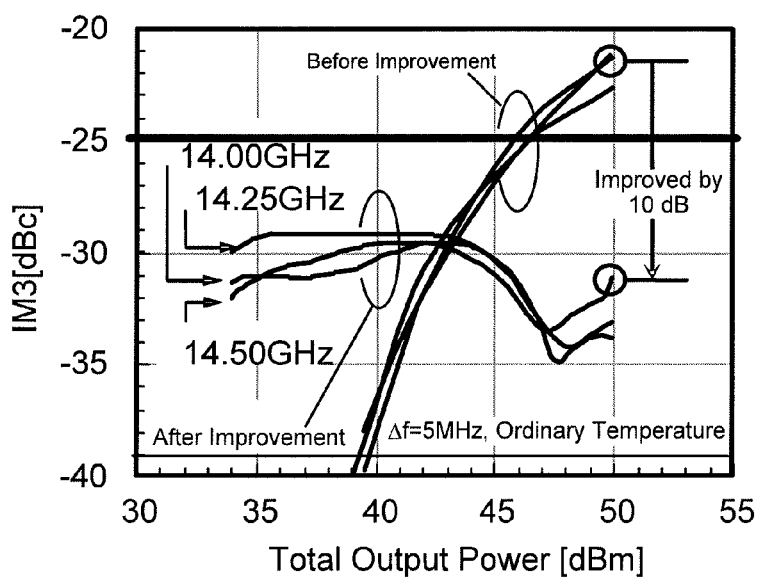
FIG. 6 is a diagram illustrating a characteristic example of the power amplifying apparatus illustrated in FIG. 3.

FIG. 6 illustrates a characteristic example of the power amplifying apparatus using the GaN FET having the characteristic illustrated in FIGS. 1, 2, 4 (in which the idling current $I_{dset1}$ of the first amplifying unit 10 is 15% of the reference current $I_{dss}$, and the idling current $I_{dset2}$ of the second amplifying unit 20 is 5% of the reference current $I_{dss}$). As illustrated in FIG. 6, it can be seen that when the amplifier output is large, the IM3 characteristic is improved largely, and the IM3 characteristic is improved stably in amplifier output levels in a wide range.

Thus, in the power amplifying apparatus of this embodiment, the two amplifiers are operated in the region where the IM3 improves with respect to the amplifier output, and thus a improved IM3 characteristic can be obtained stably in amplifier output levels in a wide range. Further, in the power amplifying apparatus of this embodiment, the operating points of all the amplifiers formed are set in a state that the amplifier output is distorted. That is, the wider the non-linear region, the wider the amplifier output range which can be compensated. Particularly when amplifying elements with an extremely wide non-linear region like the GaN FET is used, it becomes possible to have a wide signal level in which distortions can be compensated.

Further, in the power amplifying apparatus of this embodiment, in all the stages of the first amplifying unit 10 and the second amplifying unit 20, the bias is set so that the idle current becomes smaller than the standard operating point. Therefore, the efficiency of the entire power amplifying apparatus improves, and standby power consumption while no transmission is performed can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power amplifying apparatus, comprising:
   a first amplifying unit having a gallium nitride (GaN) field effect transistor (FET) as a first amplifying element to amplify an input signal;
   a second amplifying unit having a gallium nitride (GaN) field effect transistor (FET) as a second amplifying element to amplify an output signal from the first amplifying unit; and
   a bias supply unit giving bias values to the first amplifying element and the second amplifying element, respectively, the bias values causing the first amplifying element and the second amplifying element to operate in a non-linear region, the bias supply unit setting the bias values to cause an idling current of the second amplifying element to be smaller than an idling current of the first amplifying element in a range of 5% to 15% with reference to an idling current in a state that no bias is given to the first amplifying element and the second amplifying element.

2. The power amplifying apparatus according to claim 1, wherein the bias supply unit sets the bias value to be given to the first amplifying element to cause an idling current of 5% to 15% with reference to an idling current in a state that no bias is given; and wherein the bias supply unit sets the bias value to be given to the second amplifying element to cause an idling current of about 5% with reference to an idling current in a state that no bias is given.

* * * * *